United States Patent [19]
Petrosky et al.

[11] 4,253,168
[45] Feb. 24, 1981

[54] CCD SIGNAL PROCESSOR

[75] Inventors: Kenneth J. Petrosky, Glen Burnie; Marvin H. White, Columbia, both of Md.

[73] Assignee: Westinghouse Electric Corp., Pittsburgh, Pa.

[21] Appl. No.: 953,810

[22] Filed: Oct. 23, 1978

[51] Int. Cl.³ .......................... H03H 7/20; G01S 3/80
[52] U.S. Cl. .................................. 367/123; 333/165; 357/24; 307/221 D
[58] Field of Search ............................... 340/1 R, 6 R; 307/221 D; 357/24; 333/150, 152, 165; 367/103, 123

[56] References Cited
U.S. PATENT DOCUMENTS 3,883,437  5/1975  Nummedal et al. ............... 357/24 X
4,152,678  5/1979  Shott et al. ........................ 333/150

OTHER PUBLICATIONS

White et al., 1976, IEEE International Solid State Circuits Conference, pp. 194, 195.
Shott et al., 1976, IEEE International Solid State Circuits Conference, pp. 200, 201.

Primary Examiner—Richard A. Farley
Attorney, Agent, or Firm—D. Schron

[57] ABSTRACT

Apparatus for forming one or more sonar beams in response to acoustic energy received by a transducer array. To minimize volume utilization, a plurality of CCD's are formed on an integrated circuit chip with the CCD's being of progressively smaller length. Half of the CCD array is folded over to match the other half so that each CCD has an opposing CCD with both CCD's propagating a signal toward a common output diode. By providing one integrated circuit chip for each desired beam with appropriately different clocking frequencies multiple beams may be formed, and with the provision of a variable clocking frequency, one or more beams may be steered.

Transversal filter operations may also be performed by the apparatus.

11 Claims, 26 Drawing Figures

FIG. IOA

FIG. IOC

CCD SIGNAL PROCESSOR

BACKGROUND OF THE INVENTION

1. Field of the Invention:

The invention in general relates to integrated circuit devices, and more specifically to an integrated circuit device particularly well adapted for use in the sonar field for forming beams.

2. Description of the Prior Art

Various acoustic imaging and/or sensing systems require the formation of one or more beams. For example, an underwater detection system may employ a plurality of hydrophone sensors which, together with signal processing circuitry, form multiple simultaneous beams to search large volumes rapidly.

In order to steer or form a beam in a particular direction, appropriate electrical delays must be provided for the output of each hydrophone sensor in such a way as to cancel propagation delay of a wave front incident on the array of hydrophone sensors, from a particular direction. Where space is not at a premium, a typical beamformer circuit may include relatively large passive delay lines or phase shifting networks connected to the sensors for supplying the necessary delays. There are however, systems in which the total volume which can be used for acoustic detection apparatus, is limited. One such example is an acoustic homing torpedo which includes a sensor array and wherein it is desired to form a beam in a particular direction, and/or form multiple beams which may have the capability of being steered.

Accordingly, for volume limited applications, the well-known charge-coupled device (CCD) has been suggested as an integrated circuit substitute for the delay line normally used in beam forming applications.

In one proposed system, a plurality of standard length CCD's is provided, each one connected to a respective sensor element. Clocking signals provided to the CCD's step an injected signal along the lengths thereof. In order to achieve different delay times, however, a different stepping frequency must be used for each CCD, necessitating a complicated clock generator system.

In another proposed system a single clock generator provides identical signals to a plurality of CCD's, each connected to a respective sensor element, with the variable delay times being accomplished by tapping in to the CCD delay line at appropriate positions. This type of arrangement requires separate output circuits at each of the tap positions, and with a multiplicity of beams to be formed, the arrangement requires a great deal of interconnects between the CCD's and a summing amplifier and it has been found that the dynamic range of such device is somewhat limited.

One CCD arrangement, such as described on page 200 of the 1976 IEEE International Solid State Circuits Conference Digest of Technical Papers, forms an electronic lens by connecting the outputs of transducer elements of an array to a plurality of CCD devices of varying length. The arrangement uses two groups of cascaded CCD's with the second group requiring a different clock frequency.

SUMMARY OF THE INVENTION

The integrated circuit chip of the present invention is particularly well adapted for sonar beamforming and does so with a minimized chip area for the job required with an extremely high dynamic range.

The beamformer apparatus includes a plurality of acoustic sensors each of which provides a respective output signal in response to received acoustic energy. The output signals from the sensors are provided to chosen ones of a plurality of CCD's of varying length, formed within an integrated circuit chip. Means are provided for propagating, along the length of the CCD's, the signals provided thereto. The plurality of CCD's are divided into a first and second group arrangement with the CCD's of the first group being colinearly arranged with respective CCD's of the second group in a manner that the signals being propagated in respective colinearly arranged CCD's propagate toward one another to a CCD output means. The output means of the CCD's is connected to an output circuit which is defined in the same integrated circuit chip. The output circuit includes both MOS (metal-oxide semiconductor) transistors as well as a bipolar output transistor for providing a beam output signal.

Although highly desirable as a beamformer, the integrated circuit may additionally be used for other signal processing functions, such as a filter device.

DESCRIPTION OF THE PREFERRED EMBODIMENTS

Figure 1:
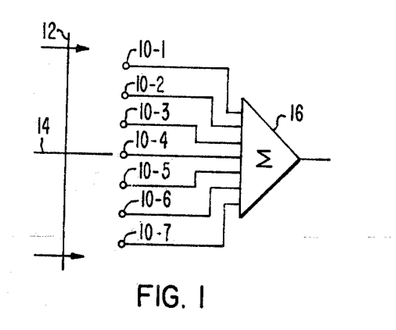
FIGS. 1 and 2 illustrate transducer apparatus responsive to incident acoustic energy for forming beams in different directions.

In FIG. 1 there is illustrated an array of transducer elements 10-1 to 10-7 in the path of an acoustic wave represented by wave front 12 perpendicular to the acoustic axis 14. For the orientation illustrated, the plurality of transducer elements will simultaneously provide identical output signals which are added together in summing circuit 16 to provide a beam signal indicative of the energy coming in at 0° along the acoustic axis of the array.

Figure 2:
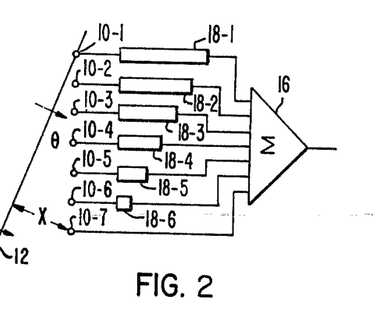

In order to form a beam for examining acoustic energy from other directions, appropriate phasing or delays must be provided for the transducer elements. For example, in FIG. 2 wave front 12 impinges upon the transducer array at a relative angle $\theta$. Basically, transducer element 10-1 will provide an output signal indicative of the wave front and this same output signal will be provided by successive transducer elements at later points in time with transducer element 10-7 providing the signal after the wave front has traveled the distance X after provision of the signal by the first transducer element 10-1. Accordingly, in order to form a beam in the direction $\theta$, there is generally provided a plurality of delay circuits 18-1 through 18-6 each of progressively smaller delay with the delays so chosen that the outputs of the transducer element in response to the wave front 12 will all arrive at the summing circuit 16 at the same point in time to provide a beam output signal. If other delay circuits of different varying lengths are additionlly connected in parallel with the transducer elements, additional beams may be formed simultaneously. Further, if the delays are varied in time, one or more beams may be steered.

Figure 3:
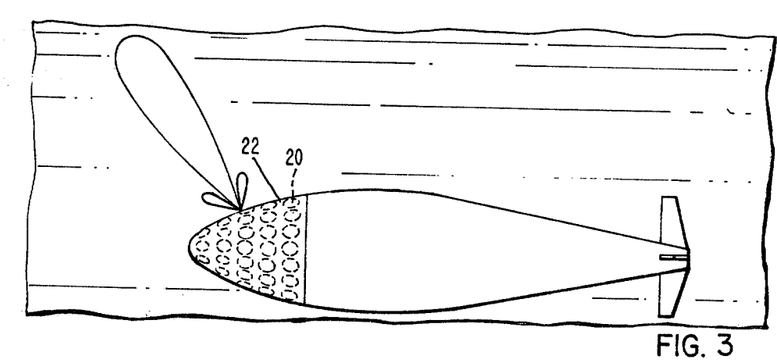
FIGS. 3 and 4 are views of torpedoes, in which beam formation is required.
Figure 4:
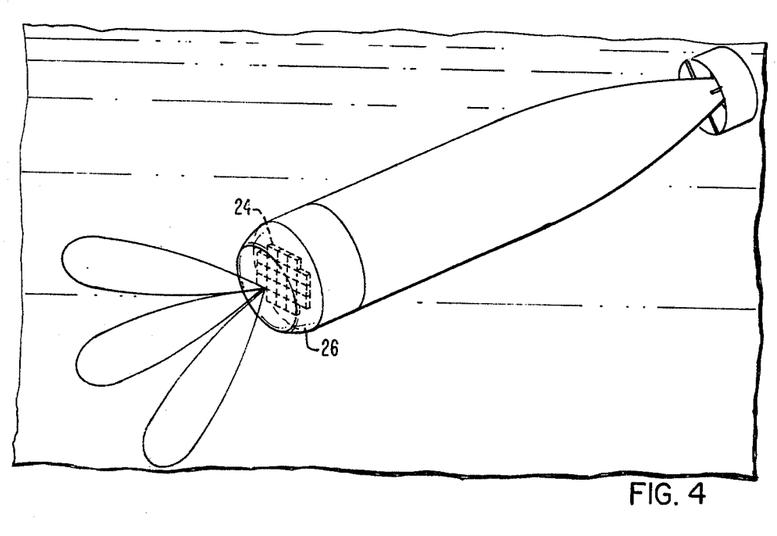

FIGS. 3 and 4 illustrate two different types of homing torpedoes which require the formation of multiple search and homing beams and wherein the volume available for such beam forming circuitry is relatively limited.

The torpedo type vehicle of FIG. 3 includes a conformal array of transducers 20 positioned behind an acoustic window 22 forming the nose of the torpedo. Another type of torpedo is illustrated in FIG. 4 and includes a planar cruciform array of transducers 24 disposed behind acoustic window 26.

Figure 5:
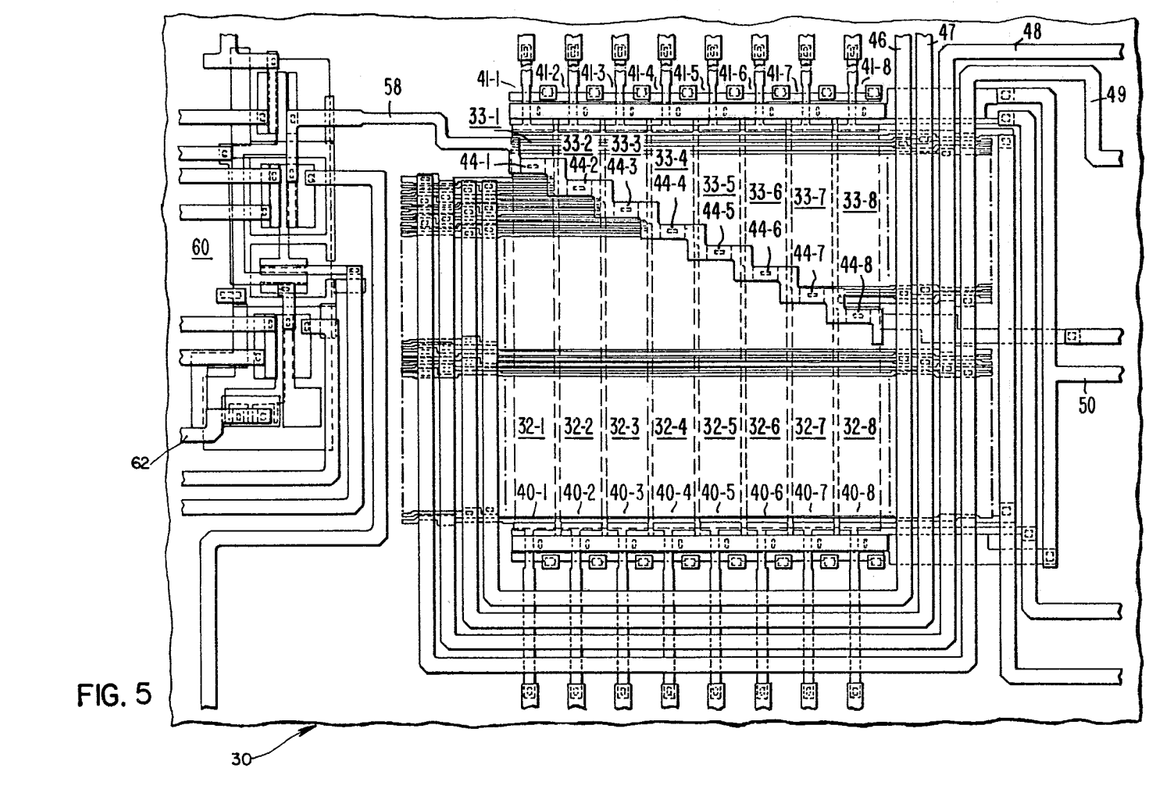
FIG. 5 is a plan view of an integrated circuit in accordance with one embodiment of the present invention.

The beamformer apparatus of the present invention, as illustrated in FIG. 5, includes an integrated circuit chip 30 of relative small volume which may be utilized with different arrays such as linear, conformal or planar, by way of example, to perform the necessary signal processing so as to form one or more beams.

Defined in the integrated circuit chip 30 is a plurality of CCD delay lines or varying length, having input means and output means, with the plurality being divided into a first group 32-1 through 32-8, and a second group 33-1 through 33-8, the number of CCD's illustrated being by way of example only.

Input circuit means 40-1 through 40-8 are provided for injecting signal charges into respective CCD's of the first group, and in a similar manner input circuit means 41-1 through 41-8 are operable to inject signal charges into the second group of CCD's.

Normally a typical CCD has an output means in the form of an output diode and in the present invention the CCD's of the first group are colinearly arranged with respective CCD's of the second group and opposing CCD's share a common output diode 44-1 to 44-8.

Clocking signals for operating the CCD's are provided on clock signal feed lines 46 to 49 to which the CCD electrodes are connected. The feed lines are seen to "wrap around" three sides of the CCD array so that clocking signals may be provided to CCD stages on either side of the diagonal string of output diodes 44-1 through 44-8.

Additional operating potential or bias for CCD operation is provided by means of lines 50 and as a result of the operation of the circuitry, a summed diode output signal is provided on line 58 to an output circuit 60, also defined in the same integrated circuit chip 30, to provide a beam output signal on line 62. Remaining connections to the output circuit 60 are for purposes of supplying the operating and biasing potentials designated, and to be further explained with respect to FIGS. 12 and 13.

Figure 6A:
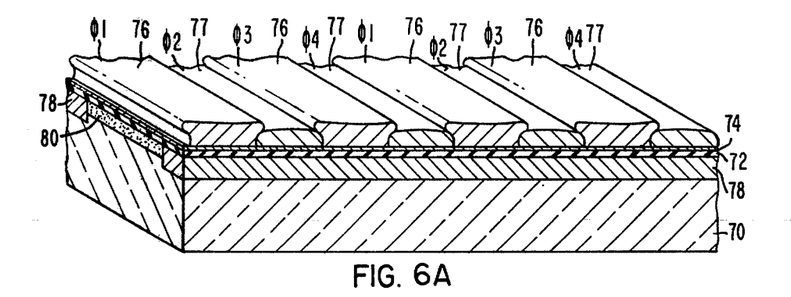
FIG. 6A is a perspective view of a portion of a CCD.

FIG. 6A illustrates a portion of a CCD delay line. The CCD includes a substrate member 70 such as an N conductivity type silicon substrate onto which is affixed an oxide layer 72 and a nitride layer 74. Disposed on top of the nitride layer 74 is a plurality of polycrystalline silicon (polysilicon) electrodes 76, 77 which overlap in a coplanar electrode pattern. Clocking signals are provided to these electrodes such that by controlling voltages on adjacent electrodes minority carriers can be moved along the silicon substrate down the delay line with the delay being inversely proportional to the clocking frequency. In the embodiment illustrated herein a 4-phase ($\phi_1$, $\phi_2$, $\phi_3$, $\phi_4$) clocking system is illustrated.

As can be seen in FIG. 5, the CCD's are parallel to one another in side-by-side arrangement. In order to laterally confine the charge being propagated, to the respective individual CCD's, the device includes channel stops 78 of high concentration N+ diffusion to maintain channel isolation. Additionally, in order to provide for high transfer efficiency for the signal charge on ion implantation region 80 is provided in the substrate 70 beneath the electrodes 76, 77.

The length along the CCD encompassed by the four electrodes $\phi_1$ through $\phi_4$ constitute one cell which offers one unit of delay. Accordingly, FIG. 6A illustrates two delay cells of a CCD. In one embodiment of the present invention and is illustrated in FIG. 5, adjacent CCD's of the first group, as well as adjacent CCD's of the second group differ in length by one unit of delay.

Figure 6B:
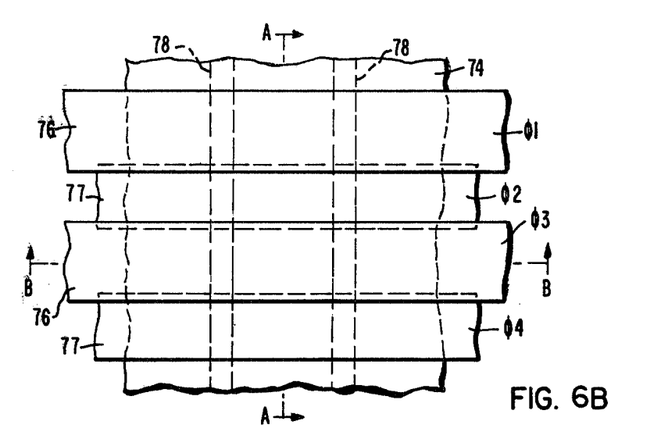
FIG. 6B is a plan view of one stage of the CCD.
Figure 6C:
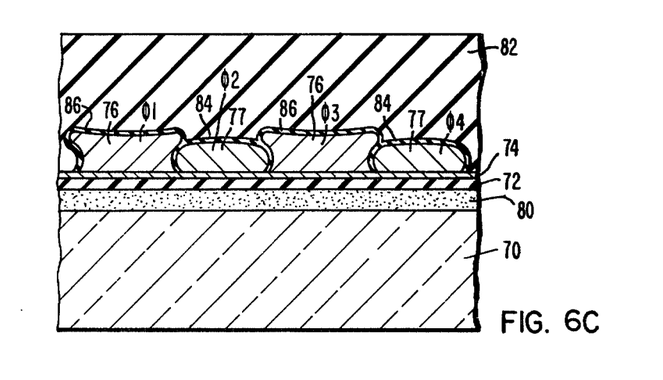
FIG. 6C is a view along line A—A of FIG. 6B.
Figure 6D:
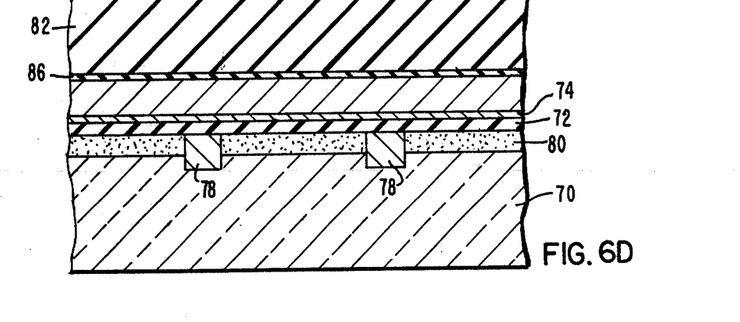
FIG. 6D is a view along line B—B.

FIG. 6B illustrates a plan view of one delay cell of a CCD, FIG. 6C is a view along line A—A and FIG. 6D is a view along line B—B of FIG. 6B. Not shown in FIGS. 6A or 6B, but shown in FIGS. 6C and 6D is a relatively thick oxide layer 82 covering the electrodes 76, 77, as well as short circuit preventing oxide layers 84 and 86 covering adjacent polysilicon electrodes 76, 77.

Figure 7A:
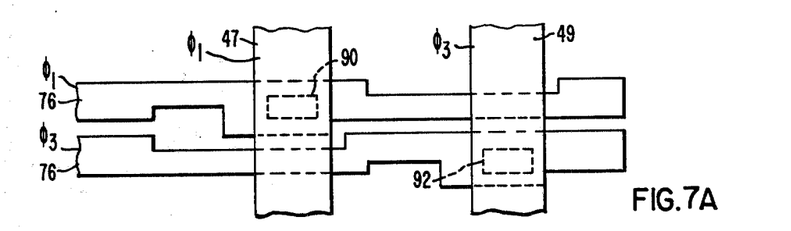
FIGS. 7A through 7C are a further view of the clock signal feed for the CCD.
Figure 7B:
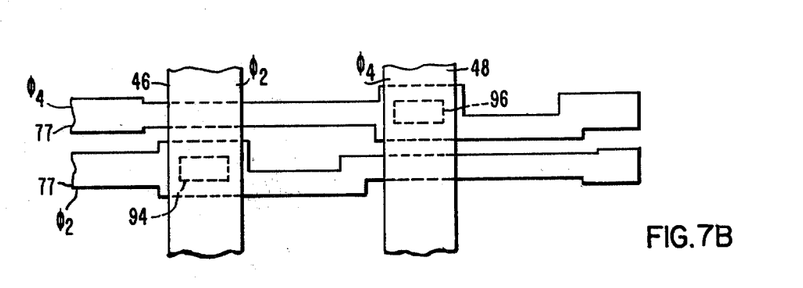
Figure 7C:
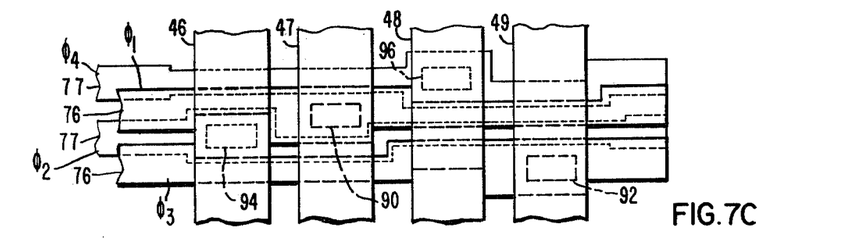

Clocking signals $\phi_1$ through $\phi_4$ are provided to the electrodes of the CCD by means of the arrangement illustrated in FIGS. 7A through 7C. As seen in FIG. 7A, clocking signal $\phi_1$ is provided on aluminum feed line 47 where, by means of a contact window 90 electrical connection is made with a first electrode 76 which extends across from 1 to 8 CCD's, depending upon its position, as best seen in FIG. 5. The $\phi_3$ signal on line 49 is provided to a second electrode 76 by means of contact window 92. In a similar manner and as illustrated in FIG. 7B, by means of contact windows 94 and 96 the $\phi_2$ and $\phi_4$ signals on lines 46 and 48 are provided to respective electrodes 77. The composite arrangement serving one CCD cell is further illustrated in FIG. 7C.

Figure 8:
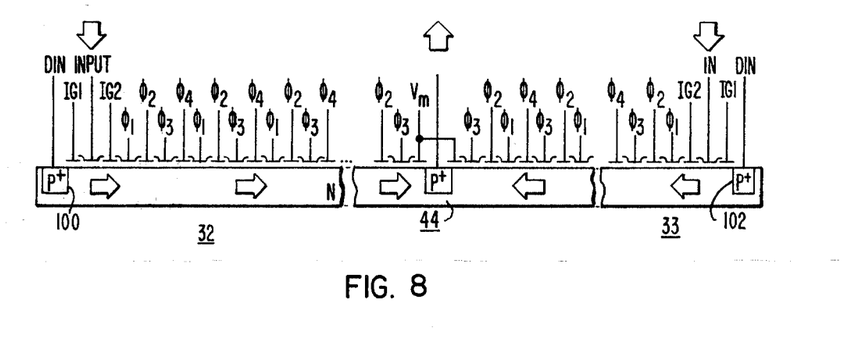
FIG. 8 is a diagrammatic illustration of the operation of a portion of the circuit of FIG. 6.

FIG. 8 is a diagrammatic cross section illustrating two colinear CCD's 32 and 33. P+ regions 100 and 102 at the input ends of the respective CCD's 32 and 33 provide a source of holes for CCD operation and are pulsed via input line $D_{in}$ to inject a charge. These minority carriers are injected into the wells formed under the electrode IG1 which is at some DC level and the input electrode which is biased to a DC level slightly below IG1. IG2 forms a barrier preventing the flow of carriers into the remainder of the CCD delay line. At a subsequent point in time a relatively high negative bias is applied to the input diode which causes the draining of excess carriers from under the first two electrodes, leaving a charge trapped under the input electrode. For a short time, prior to the application of a negative going IG2 signal there is a charge trapped under the input electrode, which charge is proportional to the difference between the DC voltage of IG1 and the highest voltage provided the input electrode. This then is the injected signal which is transferred down the delay line by application of the clocking signals $\phi_1$ through $\phi_4$. With the structure provided in the present invention and as illustrated in FIG. 8 by means of the arrows, input signals provided to the input electrodes propagate along the respective colinear CCD's toward one another to the common output diode 44 which has a potential barrier determined by a DC voltage $V_m$ applied adjacent the output diode. In operation, charge is forced over the potential barrier into the collecting diode 44 and is thereafter provided on line 58 to the output circuit 60 of FIG. 5.

In addition to saving space on the integrated circuit chip, the provision of one output diode for two CCD lines reduces the output capacitance by a factor of 2, resulting in an increased gain through the device.

Figure 9A:
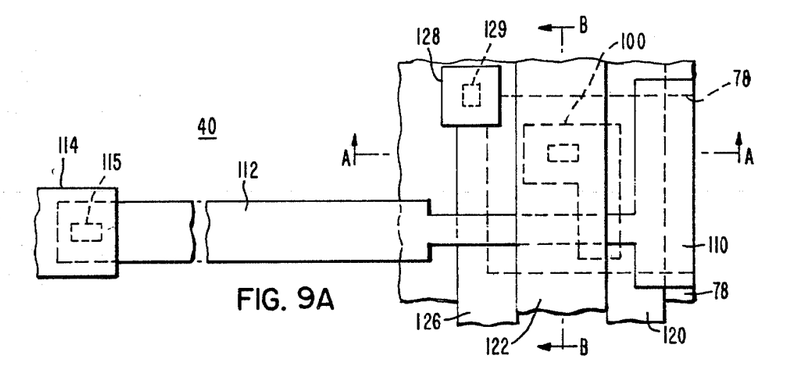
FIG. 9A is a plan view of a typical input section to the CCD.
Figure 9B:
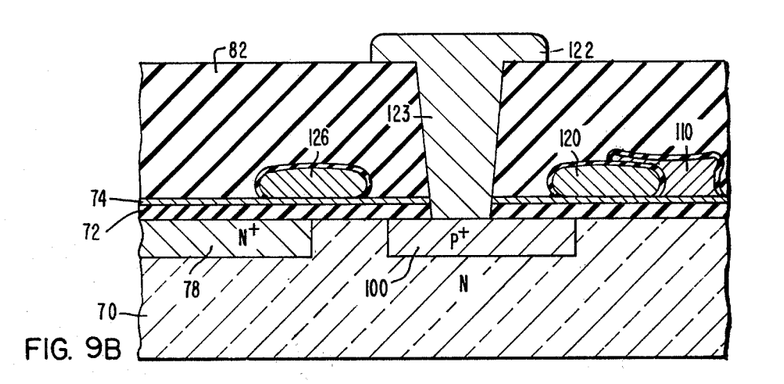
FIGS. 9B and 9C are views along lines A—A and B—B, respectively, of FIG. 9A.
Figure 9C:
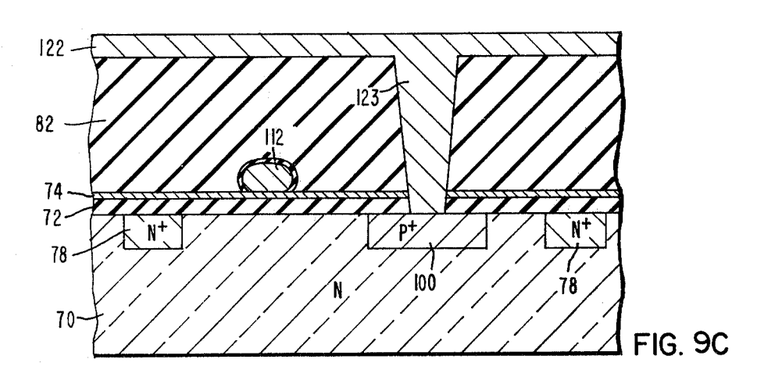

FIGS. 9A through 9C illustrate a typical input circuit 40 (or 41), FIG. 9A being a plan view, FIG. 9B a view along line A—A of FIG. 9A and FIG. 9C being a view along line B—B of FIG. 9A.

Polysilicon electrode 110 is the input electrode illustrated in FIG. 8 and is connected by a long finger portion 112 to aluminum contact lines 114 by means of a via or contact window 115. The finger portions 112 of the input circuits are illustrated in FIG. 5 as extending upwardly from one side of the CCD array, from CCD's 33-1 through 33-8, and downwardly from the opposite side of the array, from CCD's 32-1 through 32-8, these latter finger portions running under the clock lines 46 through 49.

The polysilicon electrode 120 adjacent the input electrode 110 is the electrode IG1 illustrated in FIG. 8 and as illustrated therein and in FIG. 9B has a slight overlapping with the input diode comprised of the P+ region 100 and substrate 70. Electrical contact is made to the P+ region by means of aluminum layer 122 extending down through contact window 123. This metallization extends across the entire width of the CCD array and is common to all of the input circuits so as to simultaneously pulse the input diodes thereof.

Polysilicon electrode 126 extends across the input circuit and is provided as a shield electrode, as is commonly done in such circuits, and is electrically connected to an N+ region 78 forming a ground plane, by means of metallization 128 and contact windows 129.

Figure 10A:
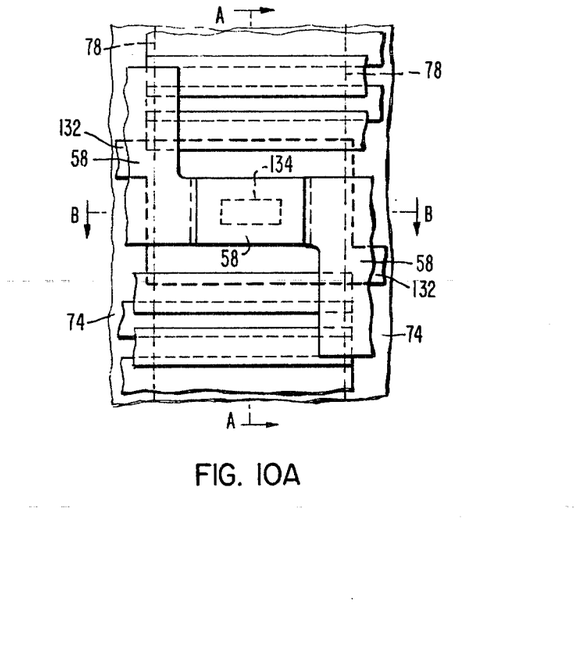
FIG. 10A is a plan view of a typical diode output.
Figure 10B:
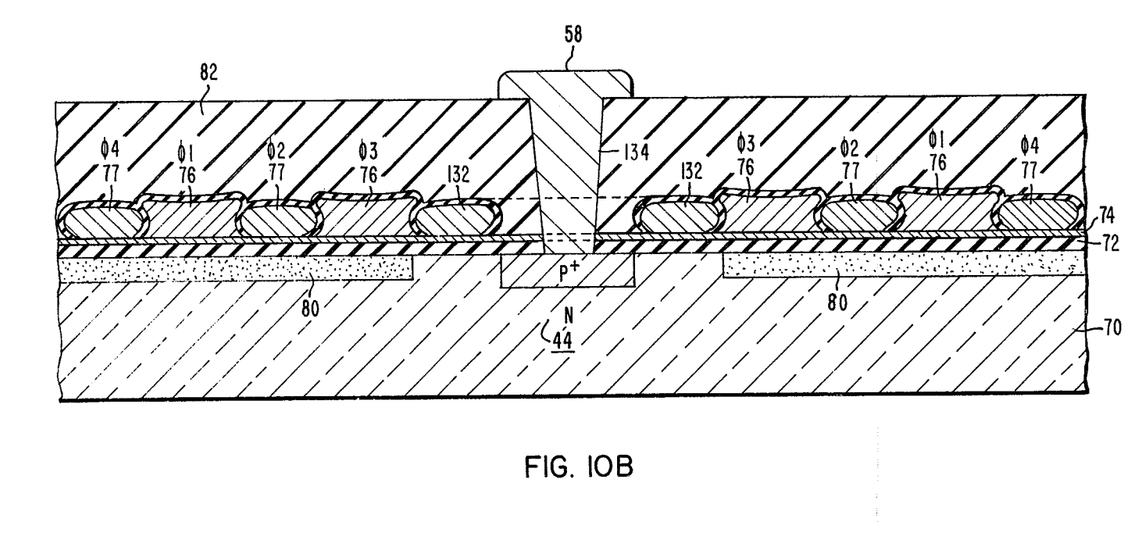
FIGS. 10B and 10C are views along lines A—A and B—B, respectively, of FIG. 10A.
Figure 10C:
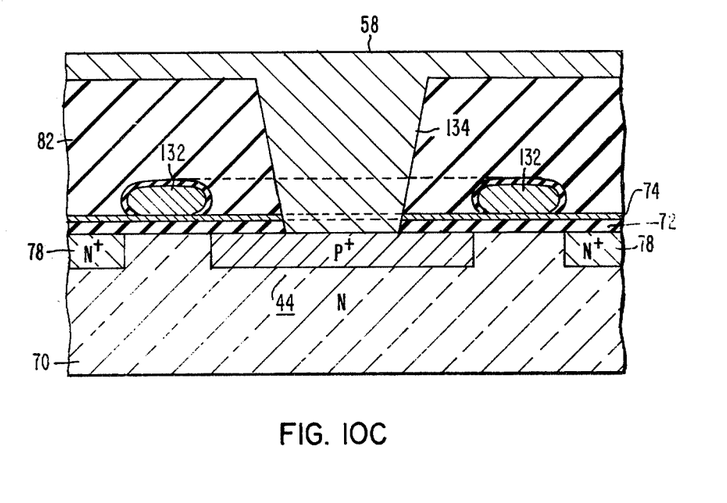

FIGS. 10A through 10C illustrate a typical output diode circuit, FIG. 10A illustrating a top view, and FIGS. 10B and 10C illustrating views along the lines A—A and B—B respectively of FIG. 10A.

Polysilicon electrode 132 is the output gate surrounding diode 44 and has the biasing voltage $V_m$ applied to it, as illustrated in FIG. 8. The remaining electrodes 76 and 77 to the right and left of electrode 132, in FIG. 10B, are the clocking electrodes for receiving clock signals $\phi_1$ through $\phi_4$, those to the left being associated with one CCD and those to the right being associated with a colinearly disposed CCD.

The aluminum line 58 forming the output line makes connection with the P+ region through contact window 134 and as can be seen in FIG. 5, the output diode structure is designed such that when two are placed next to each other but are displaced by the length of one unit delay, the output gate 132 and interconnect 58, as well as all clock electrode structures are continuous.

Figure 11:
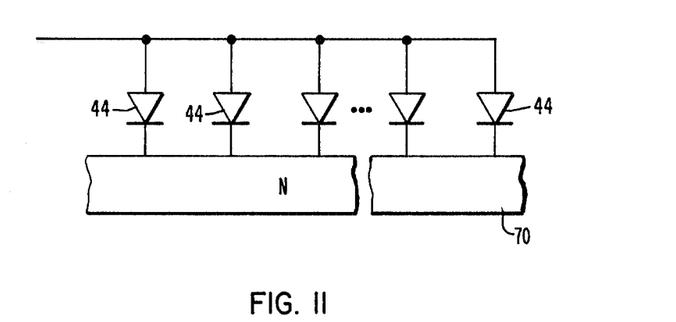
FIG. 11 is a schematic illustration of the diode readouts of FIG. 10.
Figure 12:
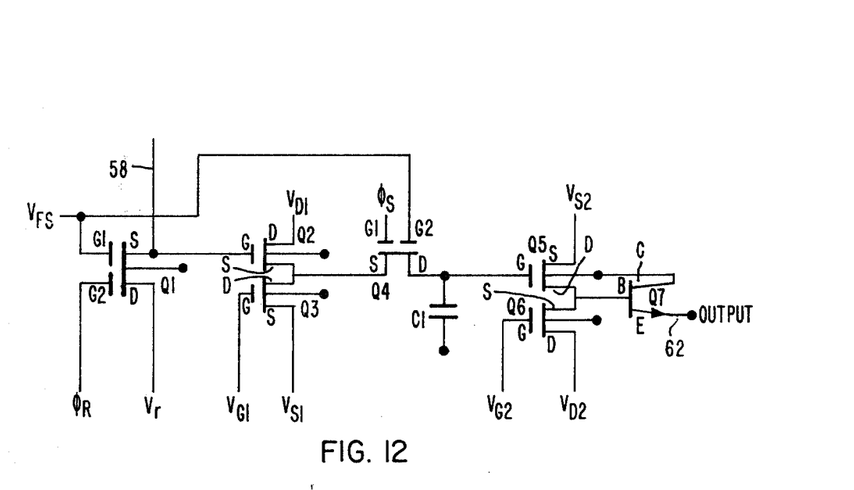
FIG. 12 is the electrical schematic representation of the output circuit illustrated in FIG. 6.
Figure 13:
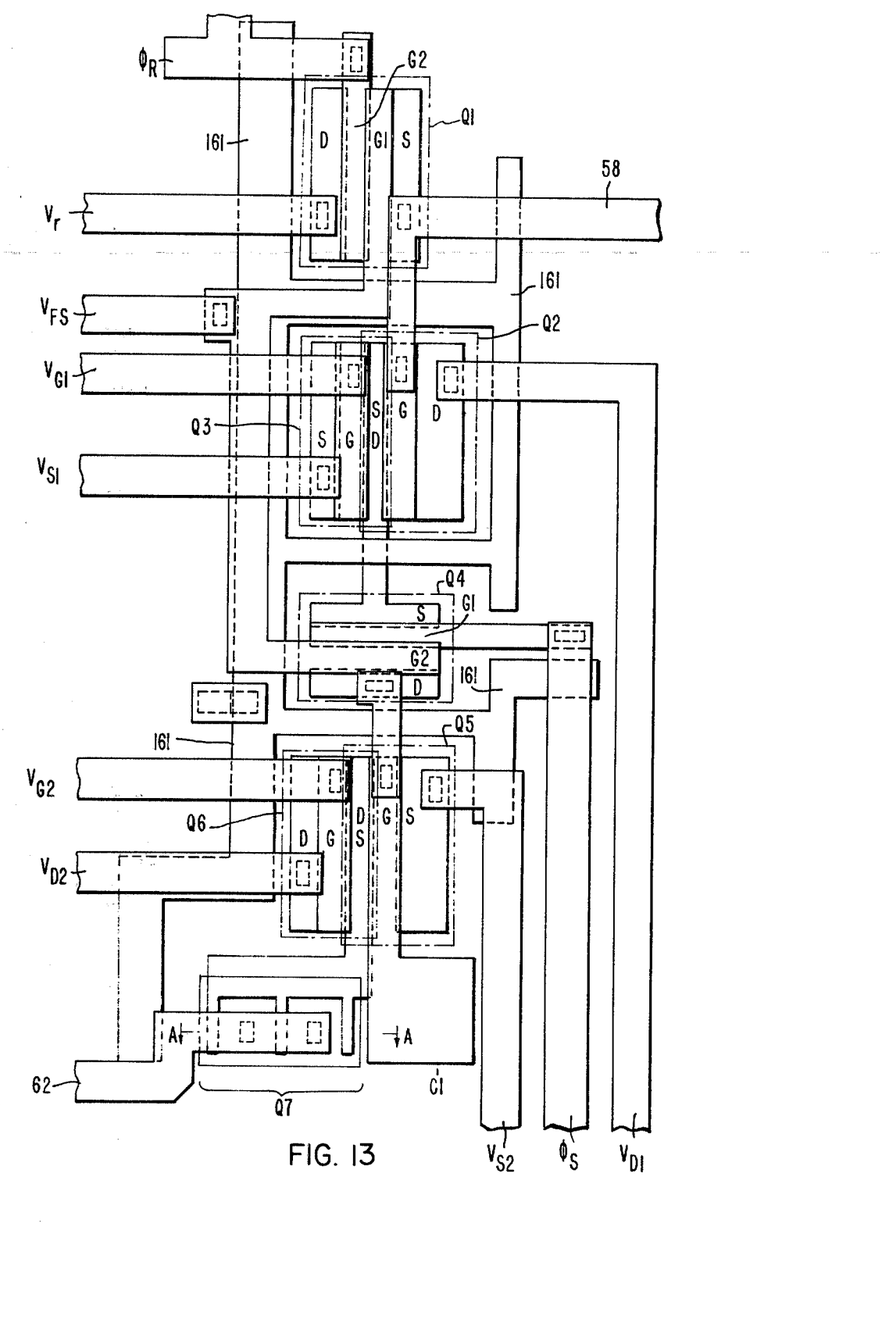
FIG. 13 is a plan view thereof.

Thus, the individual diodes, schematically illustrated in FIG. 11, in conjunction with the substrate 70, form a summing circuit with line 58 acting as a summing bus to provide the diode signal to an output circuit such as illustrated in FIGS. 12 and 13.

FIG. 12 is an electrical schematic of the output circuit which includes a plurality of transistors Q1 through Q7. Line 58 provides the diode output signal which is amplified by amplifier Q2 using Q3 as a load. Potential for the drain D of Q2 is designated $V_{D1}$ and bias potential for the gate, and source potential of Q3 are designated $V_{G1}$ and $V_{S1}$ respectively. The sample switch Q4 is then pulsed by application of a signal $\phi_s$ to gate G1 causing storage of the signal voltage on capacitor C1. The output diodes are then reset by pulsing the reset switch Q1 by means of a signal $\phi_R$ applied to gate G2 which action additionally sets the diode voltage to $V_r$, the potential applied to the drain of Q1.

The signal voltage on capacitor C1 is provided to a buffer amplifier Q5 having transistor Q6 as a load. Voltage for the source of Q5 is designated $V_{S2}$ whereas the bias voltage for the gate, and drain voltage of Q6 are designated $V_{G2}$ and $V_{D2}$ respectively.

Transistors Q1 through Q6 are MOS transistors defined in the integrated circuit chip and the output beam signal is brought off the chip by provision of a bipolar emitter follower stage Q7 also defined in the same chip. An external resistor would be connected to the output 62 to provide the beam signal.

In order to aid in reducing clock signal feed through in the output circuit, gate G1 of transistor Q1 and gate G2 of transistor Q4 are tied to a highly negative voltage $V_{FS}$ which acts as a field shield, which reduces gate to drain overlap capacitance.

The output circuit as it appears in FIG. 5 is reproduced on a larger scale in FIG. 13 and the various transistors are indicated in dotted outline with the potential of the various electrodes being provided by aluminum leads and contact windows. The various biasing and signal voltages applied to the transistors are also indicated.

In order to isolate each section of the output circuit, a polysilicon struction 161 is incorporated and acts as a field shield electrically tied to the substrate.

The bipolar transistor Q7 formed on the same integrated circuit chip provides a relatively low output impedance and allows a high current drive thereby giving the chip the capability of driving high capacitive loads, for example another CCD chip, while preventing output loading, under a wide range of load conditions.

Figure 14:
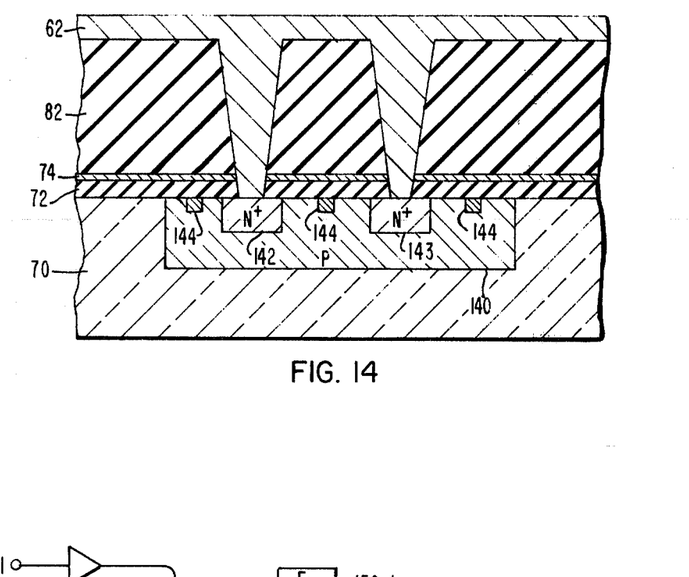
FIG. 14 is a view along line A—A of FIG. 13.

FIG. 14 is a sectional view along the lines A—A of FIG. 13 illustrating the bipolar output transistor Q7. The N substrate 70 forms the collector of the transistor and provided in the substrate is a P region 140 forming the base and N+ regions 142 and 143 forming the emitter of the transistor. Finger-like structure 144 are base contacts from the drain electrode of Q5 (the source electrode of Q6).

Figure 15:
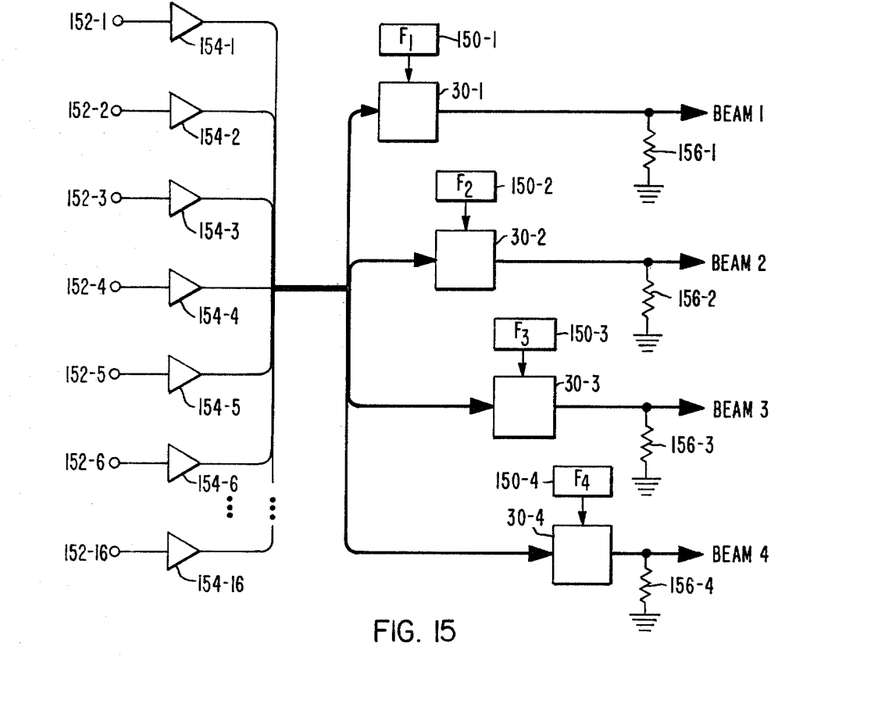
FIG. 15 is a block diagram of a typical beam former system incorporating the present invention.

Use of the present invention is illustrated in FIG. 15. Suppose, by way of example, that it is desired to form four different beams with the 16-input device described. Four such devices 30-1 through 30-4 therefore are provided each with a soucre of clock signals 150-1 through 150-4 of respectively different clocking frequencies $F_1$ through $F_4$. An array of transducer elements 152-1 through 152-16 provide respective output signals of preamplifiers 154-1 through 154-16 and the individual output signals thereof are provided to the 16 inputs of each of the CCD devices 30-1 through 30-4.

Since each CCD arrangement is provided with different frequency clocking signals, beams are formed in respectively different directions and the beam signals 1 through 4 appear across output resistors 156-1 through 156-4.

Depending upon the transducer array and the beam or beams desired, there may be instances where the outputs of two or more transducer elements are pre-summed and provided to a single CCD input. Other operations may require fewer transducer elements, however the same chip may be utilized with connections to less than the full complement of inputs. For relatively larger transducer arrays than that illustrated in FIG. 15, a device with a greater number of CCD's must be provided and by way of example a 64-input device is illustrated in FIG. 16.

Figure 16:
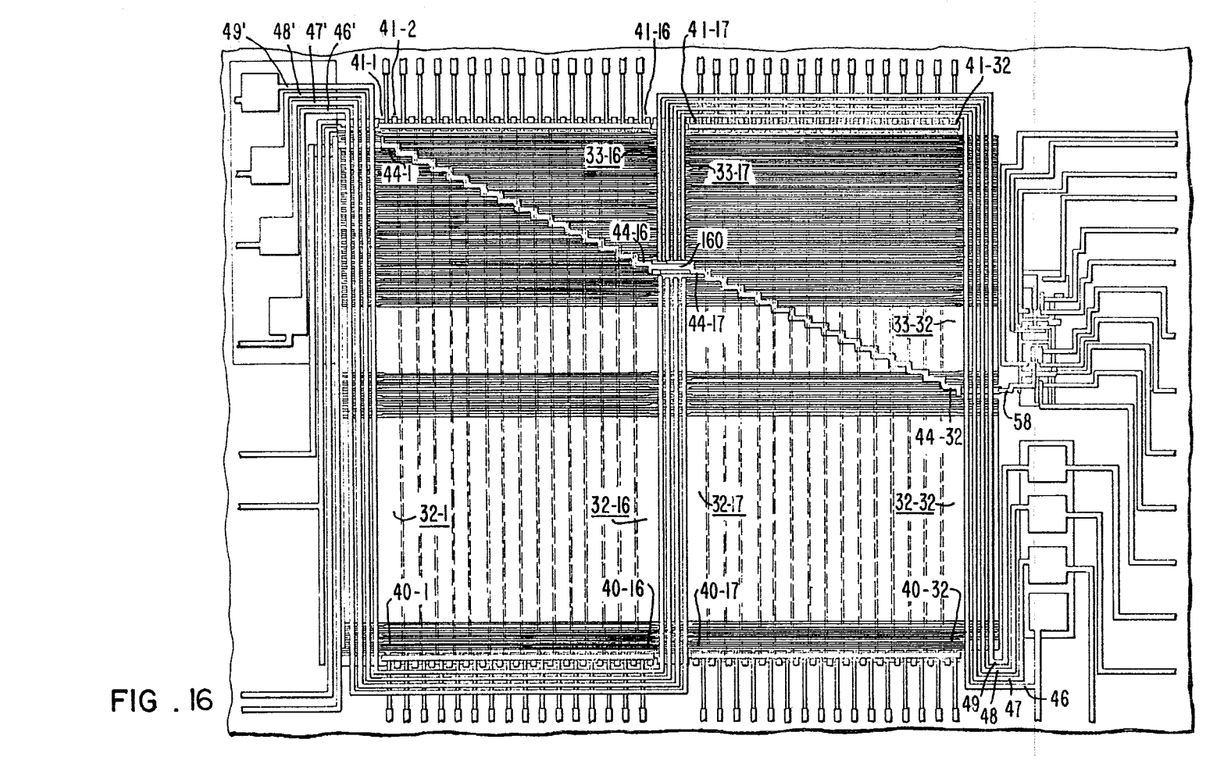
FIG. 16 is a plan view of an integrated circuit in accordance with another embodiment of the present invention.

The circuit of FIG. 16 is identical in most respects to the circuit of FIG. 5 and similar components have been given like reference numerals. One difference is the arrangement of the clock signal feed lines 46 through 49. Due to the fact that the CCD array is 32 devices wide, clock feed lines 46 through 49 are brought up the right side of the array, over the top for a distance of half the array width, and then down the middle of the CCD array to area 160 forming part of the output diode structure. A second set of clock signal feed lines 46' through 49', receiving the identical signals as lines 46 through 49, are brought down the left side of the array, across the bottom for half the width of the array and then up the middle also to the vicinity of point 160 whereby all of the unit cells of the CCD's receive the proper clocking signals.

In instances where two or more transducer outputs require the same delay, the CCD array can be fabricated so that more than one delay of the same length can be implemented on the integrated circuit chip, to thereby eliminate the need for pre-summing networks. Additionally, clock signal generation circuitry can be included on the chip itself so that only a master oscillator external connection would have to be made.

The particular layout and function of the integrated circuit chip described herein is also well adapted for various other signal processing functions. For example, an input signal may be provided to selected ones of the CCD inputs to form a transversal filter. Thus, in FIG. 17, a source of clock signals 164 is provided to the previously-described device 30. An input signal at terminal 166 is supplied to a weighting network 170-1 to 170-n, which by way of example may be resistor chains, resistor dividers, and amplifiers and even inverting amplifiers to provide negative weighting for implementing a particular transfer function, governed by the weighting pattern.

Figure 17:
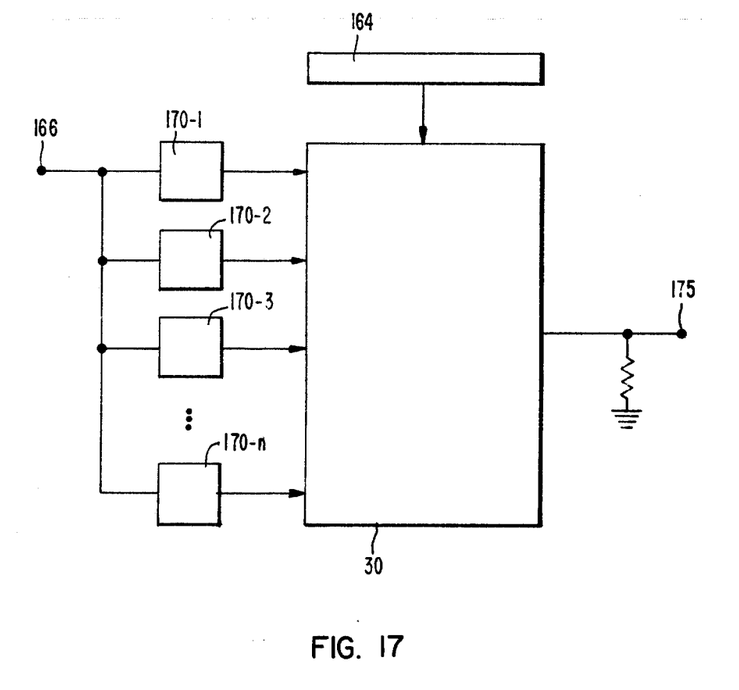
FIG. 17 illustrates another function for the present invention.

By way of example, one transversal filter function was provided by the device described herein by application of the weighted input signal to CCDS of the following units of delay:

| Weighted Signal | Units of CCD Delay |
|---|---|
| 1 | 1 and 15 |
| .728 | 3 and 13 |
| .323 | 5 and 11 |
| .11 | 7 and 9 |

With these parameters and a clocking frequency of 500 KHz, the device performed as a low pass filter with a bandwidth to 10 KHz. Since the bandwidth is directly proportional to the clocking frequency greater or smaller bandwidths may be provided simply by increasing or decreasing the clock frequency.

Thus, any output signal at output 175 is the result of tailoring the various given parameters.

We claim:
1. Signal processing apparatus comprising:
 (A) an integrated circuit chip having defined therein a plurality of CCD's each having an input means and an output means;
 (B) means for providing chosen ones of said CCD input means with respective input signals;
 (C) means for propagating, along the length of said CCD's, the respective said signals provided thereto;
 (D) said plurality of CCD's being comprised of a first and second group;
 (E) said CCD's of said first group being colinearly arranged with respective CCD's of said second group in a manner that signals in respective colinearly arranged CCD's propagate toward one another to said CCD output means;
 (F) an output circuit;
 (G) means for connecting said output means of said CCD's with said output circuit;
 (H) said output circuit being responsive to the signal provided thereto by said output means to provide an output signal.
2. Apparatus according to claim 1 which includes:
 (A) a plurality of acoustic sensors each providing a respective output signal in response to received acoustic energy; and
 (B) means for providing said sensor output signals to chosen ones of said CCD input means.
3. Apparatus according to claim 1 wherein:
 (A) said output circuit is fabricated as part of said integrated circuit chip.
4. Apparatus according to claim 1 wherein:
 (A) the output means for one CCD of said first group is the same for a colinearly opposed CCD of said second group.
5. Apparatus according to claim 1 wherein:
 (A) said plurality CCD's are of varying length.
6. Apparatus according to claim 5 wherein:
 (A) the CCD's of said first group are parallel to one another; and
 (B) the CCD's of said second group are parallel to one another.
7. Apparatus according to claim 6 wherein:
 (A) adjacent CCD's of each group differ in length by one unit of CCD delay.
8. Apparatus according to claim 2 wherein:
 (A) each of said acoustic sensors is connected with a respective CCD input means.
9. Apparatus according to claim 1 wherein:
 (A) the CCD's of said first group are parallel to one another;
 (B) the CCD's of said second group are parallel to one another;

(C) said CCD's define an array having first, second, third and fourth sides;
(D) said means for propagating include a plurality of clock signal feed lines;
(E) said feed lines being wrapped around and adjacent to three of said sides.

10. Apparatus according to claim 1 wherein:
(A) the CCD's of said first group are parallel to one another;
(B) the CCD's of said second group are parallel to one another;
(C) said CCD's defining an array having first, second, third and fourth sides;
(D) said means for propagating including a first plurality of clock signal feed lines;
(E) said means for propagating including a second plurality of clock signal feed lines;
(F) said first plurality of feed lines extend along said first side and then along the adjacent second side and then down the middle of said array for a predetermined distance;
(G) said second plurality of feed lines extend along said third side and then along the adjacent fourth side and then up the middle of said array for a predetermined distance;

11. Apparatus according to claim 9 wherein:
(A) said input means are positioned along said second and fourth sides of said array.

* * * * *